(12) United States Patent
McPherson et al.

(10) Patent No.: US 9,381,537 B2
(45) Date of Patent: Jul. 5, 2016

(54) MULTIFUNCTION TOOLING FIXTURE ASSEMBLY FOR USE IN A COATING RELATED OPERATIONS

(71) Applicants: David A. McPherson, Coatesville, IN (US); Albert Feuerstein, Carmel, IN (US); Thomas F. Lewis, III, Zionsville, IN (US); Don Lemen, Indianapolis, IN (US); Ardy Kleyman, Carmel, IN (US); Andrew Thomas Westfall, Brownsburg, IN (US)

(72) Inventors: David A. McPherson, Coatesville, IN (US); Albert Feuerstein, Carmel, IN (US); Thomas F. Lewis, III, Zionsville, IN (US); Don Lemen, Indianapolis, IN (US); Ardy Kleyman, Carmel, IN (US); Andrew Thomas Westfall, Brownsburg, IN (US)

(73) Assignee: PRAXAIR TECHNOLOGY, INC., Danbury, CT (US)

(*) Notice: Subject to any disclaimer, the term of this patent is extended or adjusted under 35 U.S.C. 154(b) by 0 days.

(21) Appl. No.: 13/708,204

(22) Filed: Dec. 7, 2012

(65) Prior Publication Data
US 2013/0177707 A1    Jul. 11, 2013

Related U.S. Application Data

(60) Provisional application No. 61/568,361, filed on Dec. 8, 2011.

(51) Int. Cl.
*B05C 13/02*   (2006.01)
*C23C 14/50*   (2006.01)
*C23C 14/56*   (2006.01)

(52) U.S. Cl.
CPC ............... *B05C 13/02* (2013.01); *C23C 14/505* (2013.01); *C23C 14/56* (2013.01)

(58) Field of Classification Search
CPC ......... B05D 1/32; B05C 13/02; C23C 14/505
USPC ................................................. 427/282
See application file for complete search history.

(56) References Cited

U.S. PATENT DOCUMENTS

| 5,803,971 | A * | 9/1998 | Menchetti | B05C 13/02 118/500 |
|---|---|---|---|---|
| 5,997,947 | A | 12/1999 | Burns et al. | |
| 7,837,843 | B2 | 11/2010 | Sharp et al. | |
| 8,323,409 | B2 | 12/2012 | Schlichting et al. | |
| 2002/0062791 | A1 | 5/2002 | Ginovker et al. | |
| 2007/0245955 | A1 | 10/2007 | Stohl et al. | |
| 2011/0083604 | A1 * | 4/2011 | Esser | 118/500 |
| 2011/0247558 | A1 | 10/2011 | Pei | |

FOREIGN PATENT DOCUMENTS

WO   WO2009/046928 A1   4/2009
WO   WO2009/149864 A1   12/2009

* cited by examiner

*Primary Examiner* — Dah-Wei D Yuan
*Assistant Examiner* — Stephen Kitt
(74) *Attorney, Agent, or Firm* — Nilay S. Dalal

(57) ABSTRACT

A modular, rotisserie type multifunctional tooling fixture assembly is disclosed. The disclosed tooling fixture assembly comprises a positioning ring having a plurality of anchor members configured or adapted to retain a plurality of workpieces to be processed, and a retaining base defining a plurality of retaining members configured to be in locking engagement with the anchor members of the positioning ring and retain a plurality of workpieces in a fixed orientation. The tooling fixture assembly has utility in various coating related processes, including coating and grit blasting operations.

12 Claims, 7 Drawing Sheets

MULTIFUNCTION TOOLING FIXTURE ASSEMBLY FOR USE IN A COATING RELATED OPERATIONS

The present application claims priority from U.S. application Ser. No. 61/568,361, filed Dec. 8, 2011, which is incorporated by reference herein in its entirety

FIELD OF THE INVENTION

This invention relates to a multifunctional tooling fixture assembly for use in various coating related operations and more particularly, to a tooling fixture assembly portions of which are suitable for use in multiple process steps during surface treatments and coatings for a plurality of workpieces, such as gas turbine high pressure turbine blades and vanes.

BACKGROUND

Physical vapor deposition is a coating process extensively used to apply ceramic thermal barrier coatings on turbine airfoils by electron beam evaporation. Extensive work has been done to design coating processes and associated fixturing to apply a uniform coating on a variety of airfoil sizes and shapes. Workpieces to be coated need to be manipulated in the vapor to achieve uniform coverage with sections of the workpiece that do not require a coating need to be masked adequately. Prior to and/or after the actual coating application, however, the same workpieces often are subjected to preparation and finishing processes.

U.S. Pat. No. 5,997,947 discloses a modular, rotisserie type coating fixture for use in electronic beam physical vapor deposition (EBPVD) coating processes. Tooling fixtures used in the EBPVD coating process generally include a support structure and means to couple the support structure and allow it to be rotated about a first axis. The tooling fixture further includes a cassette means within the support structure for holding one or more workpieces to be coated in place. The cassette means are joined to the support structure by spindles which allow the cassette means to rotate about a second axis substantially parallel to the first axis and thereby allow each workpiece being coated to rotate about its longitudinal axis. The cassette means support each workpiece so that surfaces of the airfoil to be coated are maintained substantially parallel to the coating source. This fixture is useful only for the coating process and generally not useful for any preparation or finishing steps that the workpieces may be subjected to.

U.S. Pat. No. 7,837,843 discloses another rotisserie type tooling fixture assembly for use in a physical vapor deposition coating operation which comprises a cylindrical type support structure comprising a circular base member, a circular top member opposite the circular base member, and a plurality of structural members joining the top member to said base member. The workpieces are arranged in a plurality of panel members aligned in a staggered vertical direction around the outer periphery of said support structure forming the cylinder-like structure. Again, this tooling fixture assembly is specifically designed for the EBPVD coating process and not particularly useful for any preparation or finishing processes that the workpieces may be subjected to.

What is needed therefore is a tooling fixture assembly or portions thereof that can be used in several different preparation, coating and finishing steps without the need to disassemble and re-assemble the workpieces into the tooling fixture assembly.

SUMMARY OF THE INVENTION

In one aspect, this invention may be characterized as a modular, rotisserie type tooling fixture assembly for use in multiple different coating related operations, the tooling fixture assembly comprising: (i) a positioning ring having a plurality of anchor members configured or adapted to retain a plurality of workpieces to be processed; and (ii) a retaining base defining a central aperture and a plurality of retaining members configured to be in locking engagement with the anchor members of the positioning ring and retain a plurality of workpieces in a fixed orientation.

In a second aspect, this invention may be characterized as a method for performing a plurality of coating related steps comprising: loading a plurality of workpieces into anchor members disposed in a prescribed radial orientation from a central aperture on a positioning ring, the anchor members configured to retain the plurality of workpieces to be coated; engaging the positioning ring with the retaining base into a locked tooling fixture assembly; locking the retaining base and the unitary masking cap together to form a tooling fixture assembly; operatively connecting an arbor or process shaft through a central aperture of the retaining base and upward through the positioning ring; operatively connecting a proximal section of the shaft to a first coating related station; processing exposed surface portions of the plurality of workpieces; removing the tooling fixture assembly from the coating related station without disassembling and re-assembling the plurality of workpieces from the tooling fixture assembly prior to use of the fixture assembly at a second coating related station.

BRIEF DESCRIPTION OF THE DRAWINGS

The above and other aspects, features, and advantages of the present invention will be more apparent from the following, more detailed description thereof, presented in conjunction with the following drawings, wherein.

DETAILED DESCRIPTION

Figure 1:
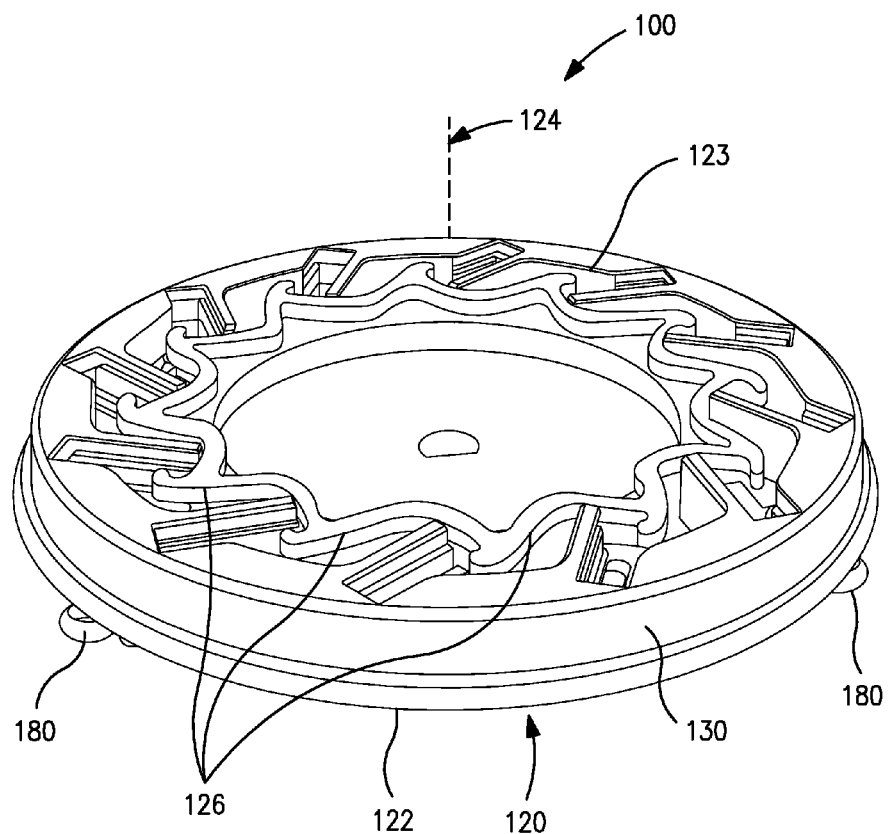
FIG. 1 is a perspective view of a multifunction tooling fixture assembly in accordance with an embodiment of the present invention.
Figure 6:
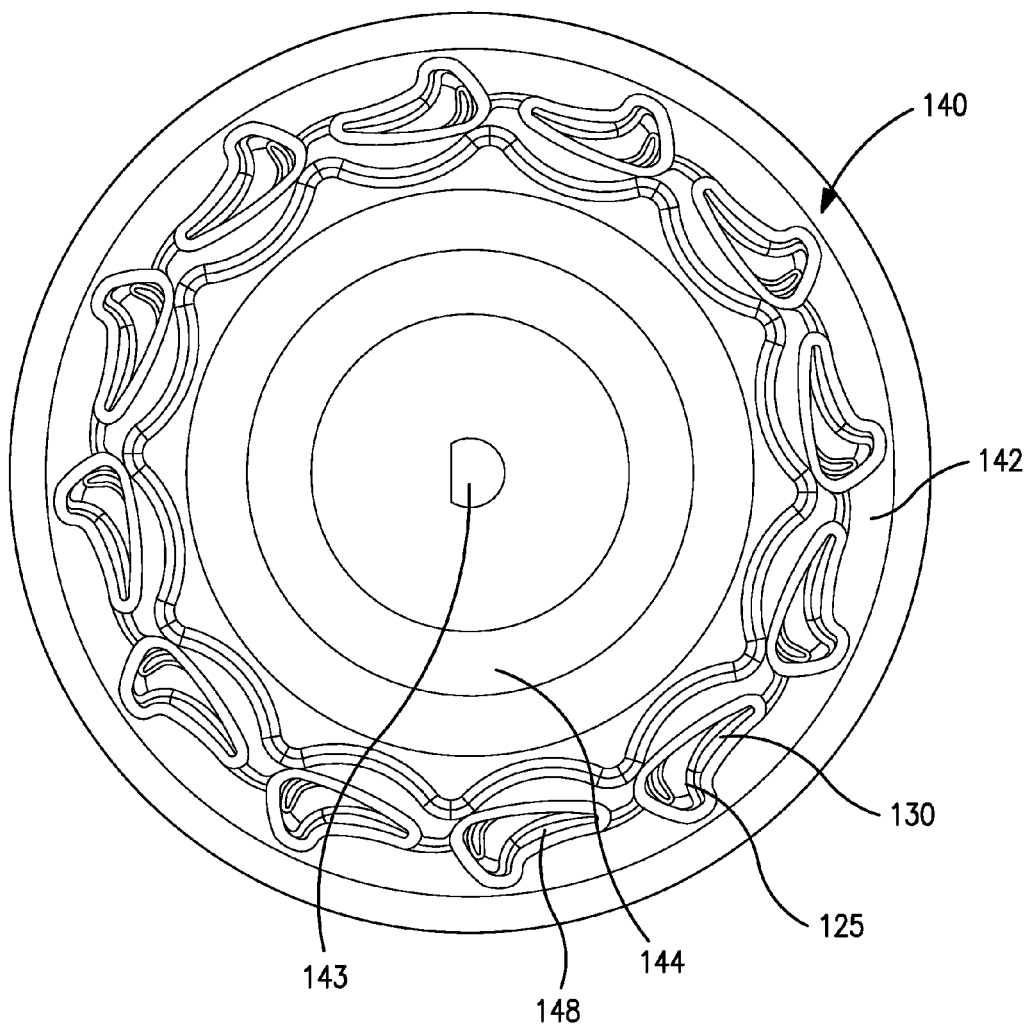
FIG. 6 is a top view of the multifunction tooling fixture assembly configured for use in a masked coating operation in accordance with an embodiment of the present invention.
Figure 7:
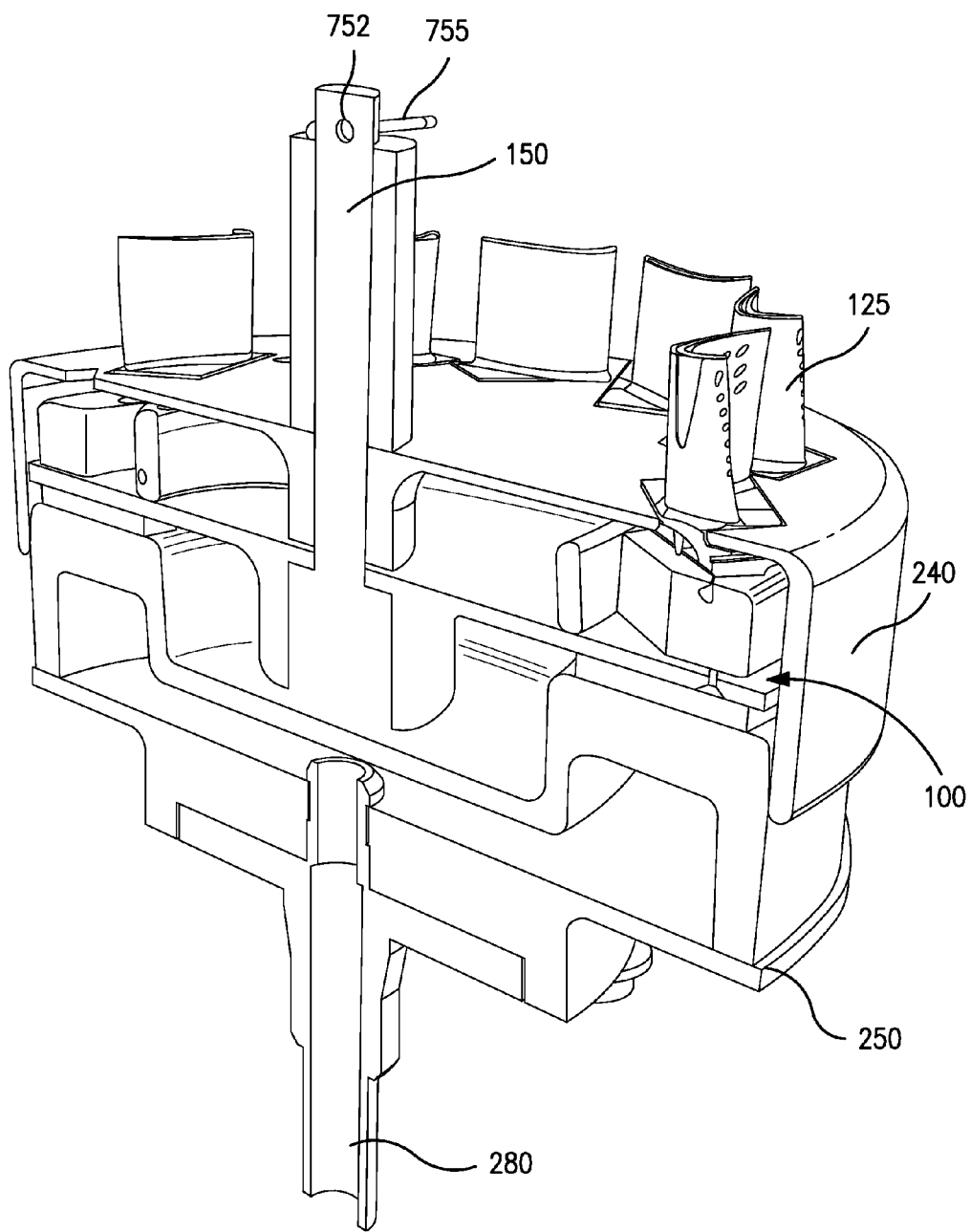
FIG. 7 is a perspective view of a multifunction tooling fixture assembly configured for use in a grit blasting operation in accordance with another embodiment of the present invention.

FIG. 1 shows an embodiment of the present tooling fixture assembly 100 including a locking or retaining base 120 and a positioning ring 130. The tooling fixture assembly 100 can be augmented with additional components tailored to the specific function or process to be performed. For example, as will be explained in FIGS. 4-6, when the workpieces 125 are to be coated, a masking element 140 can be operatively associated with the retaining base 120 and the positioning ring 130. In another example, when the workpieces 125 are to be grit blasted, additional components such as a grit cover assembly 240 in combination with seals and support structures and the like can be operatively associated with the retaining base 120 and the positioning ring 130, as shown in FIG. 7. The ability for the tooling fixture assembly 100 of the present invention to be utilized in a variety of coating related operations without disassembling and re-assembling the plurality of workpieces from the tooling fixture assembly 100 is a benefit not achievable with conventional tooling fixture assemblies.

The modular tooling fixture 100 can be loaded with any suitable workpiece 125 requiring coating related operations. In a preferred embodiment, the workpieces 125 to be processed can be rotor blades, stator vanes or airfoils. In a more preferred embodiment, the workpieces 25 are airfoil blades, as show in the Figures and embodiments of the present invention. The term "workpiece" and "airfoil blade" will be used interchangeably herein for purposes of describing and illustrating the various embodiments in accordance with the principles of the present invention, and, as such, is not intended to narrow the meaning of "workpiece."

Another unique aspect of the disclosed tooling fixture assembly 100 is the reusable combination of the retaining base 120 and positioning ring 130 in the various coating related operations. The retaining base 120 includes a platform 122 having a central aperture 123 and defining a central axis 124 orthogonal to the plane of the platform 122. The retaining base 120 also includes a plurality of retaining members 126 rising from the surface of the platform 122. The retaining members 126 are disposed in a prescribed radial orientation from the central axis 124. In the illustrated embodiments shown in the Figures, there are twelve retaining members 126 disposed in a circular orientation and/or radially around the central axis 124. Each retaining member 126 is specifically configured to engage a portion of a root section of an airfoil 125 in an abutting relationship. As FIGS. 1-3 show, each of the twelve retaining members 126 is preferably interconnected to create a continuous arm-like structure that can maintain the loaded workpieces 125 in a fixed orientation during the various coating related operations.

Figure 2:
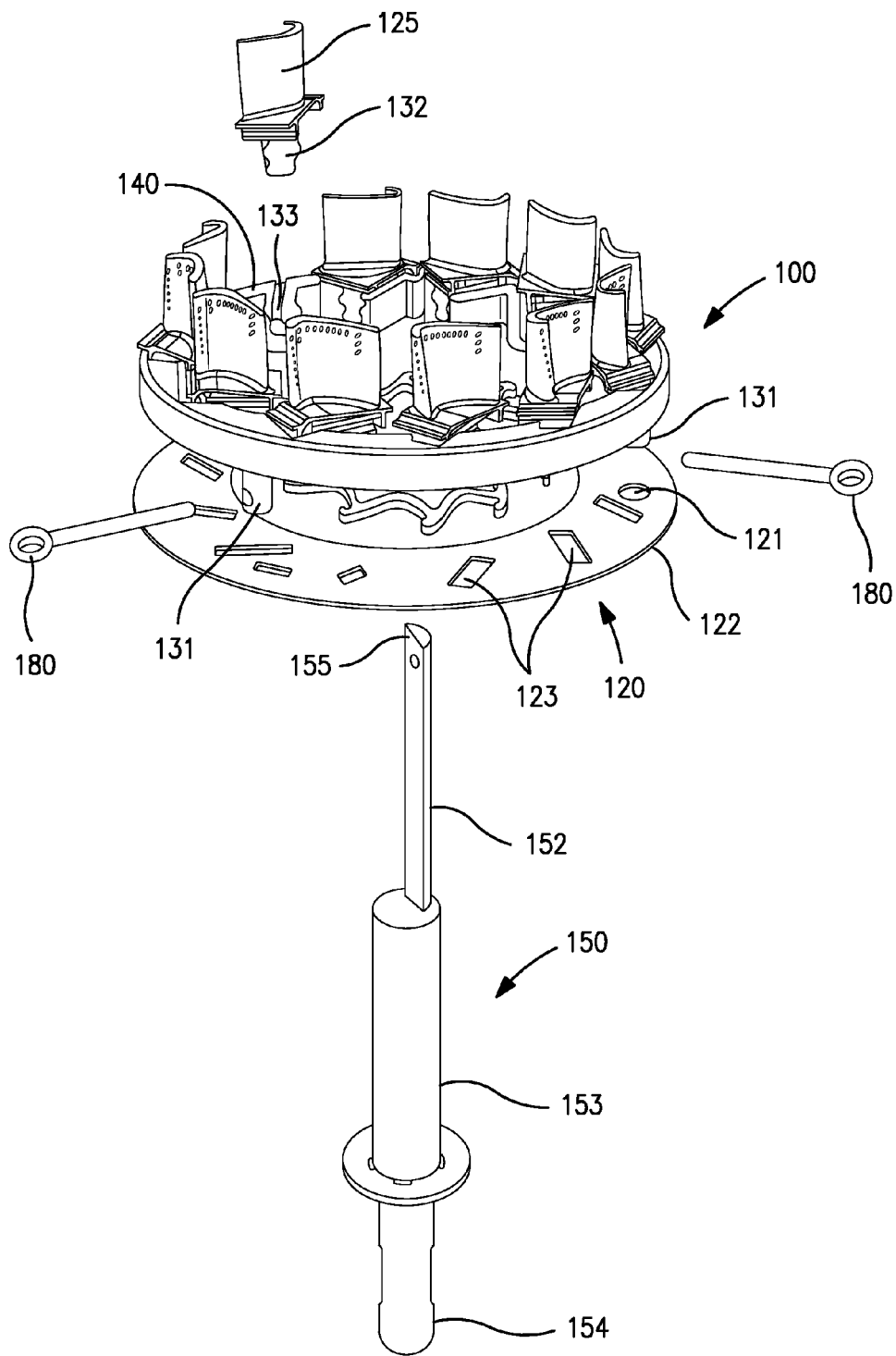
FIG. 2 is an exploded view of the multifunction tooling fixture assembly with workpieces retained onto anchor members of a positioning ring and arbor or process shaft extending through a central aperture of the fixture assembly.

As more clearly illustrated in FIG. 2, the illustrated retaining base 120 also includes a plurality of vent openings 123 that provide air passages as generally required in various coating related operations, such as grit blasting. The illustrated positioning ring 130 is a circular ring disposed in a generally parallel orientation to the retaining base 120 and engages or seats upon the retaining base 120. The positioning ring 130 includes several alignment pegs 131 extending downward from the housing 149 of the positioning ring 130 and adapted to engage with the alignment holes 121 along the periphery of the platform 122 of the retaining base 120. The design and configuration of the positioning ring 130 includes a plurality of anchor members 132 projecting inwardly toward the center of the ring 130. FIG. 2 shows that the anchor members 132 are configured to receive the base portion of an airfoil 125. The anchor members 132 are designed with a size and geometry that corresponds to that of the base portion of the airfoils 125 to allow the airfoils 125 to fit therewithin. The anchor members 132 form a slotted region (FIG. 2) within the housing portion 149 (FIG. 2) of the positioning ring 130 to receive the airfoils or workpieces 125. The specific configuration or design of the anchor members 132 are customized to correspond with the configuration of the base or root section of the workpieces 125 so as to receive and retain the plurality of workpieces 125 in a fixed orientation. In a preferred embodiment as illustrated in the Figures, the anchor members 132 along with retaining members 126 are disposed in a radial orientation around the central axis 124. Each anchor member 132 is specifically configured to receive the root section of an airfoil workpiece 125. As a result, when the anchor members 132 engage with the retaining members 126, the workpieces 125 become radially oriented about the central axis 124. The radial orientation of the workpieces 125 creates a configuration that optimizes the coating coverage of the workpieces 125. It should be understood that modification to the design of the retaining members 126 and the anchor members 132 can enable greater or less than twelve workpieces 125 to be loaded onto the base 120, and that such modification is within the scope of the present invention.

Figure 3:
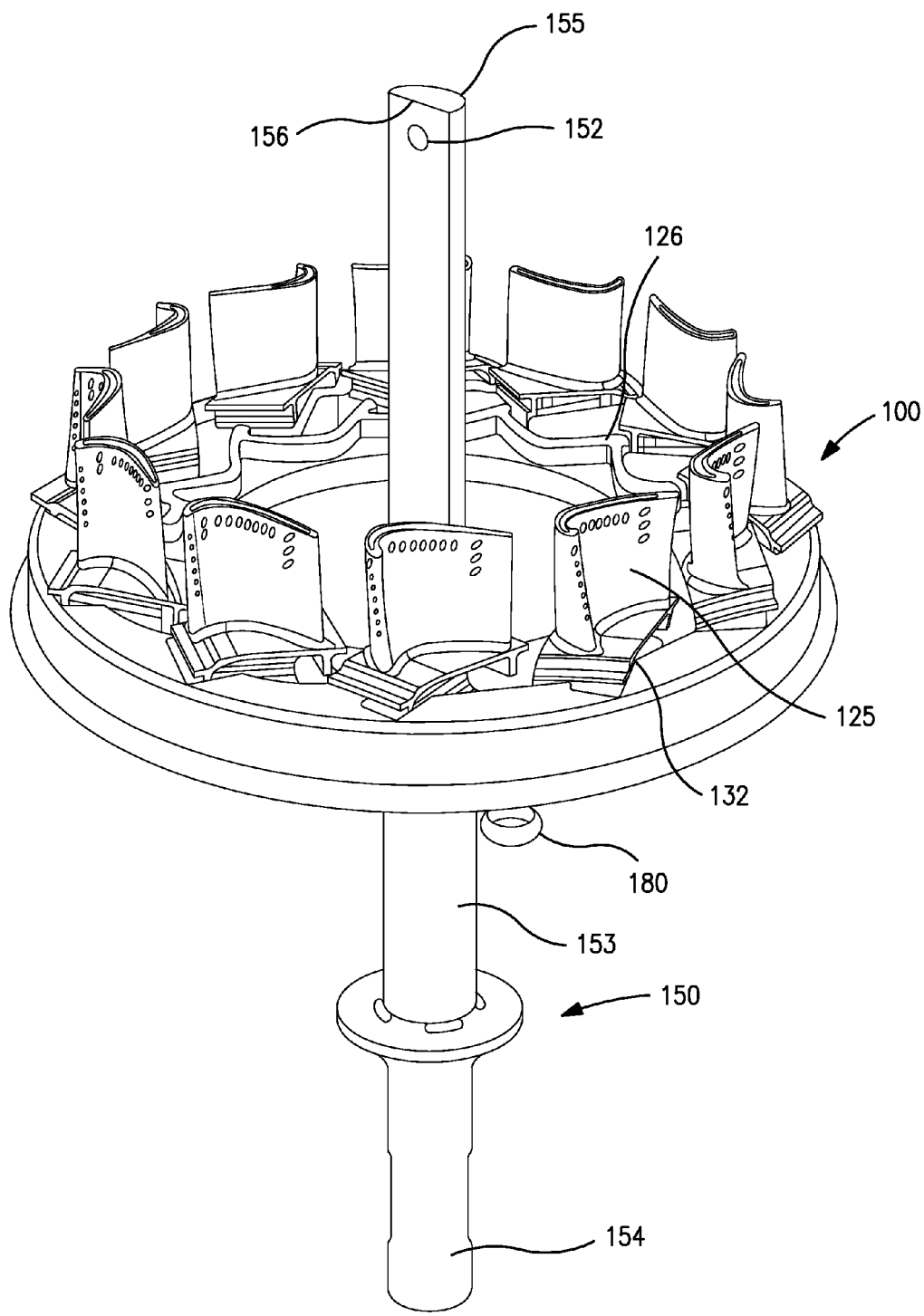
FIG. 3 is the assembled fixture assembly of FIG. 2.

When the alignment pegs 131 of the anchor members 132 extend through and engage with the alignment holes 121 of the retaining base 120, the positioning ring 130 and the retaining base 120 are rotated relative to each other so as to interlock the anchor members 132 with the retaining members 126, as shown in FIGS. 1 and 3. In the locked configuration, the anchor members 132 are aligned with the retaining members 126. The plurality of the retaining members 126 in the locked configuration provide a continuous interconnected arm-like structure that abuts against a portion of the base of workpieces 125.

When the positioning ring 130 and the retaining base 120 have been engaged into a locking arrangement, one or more auxiliary retention means such as, for example, a cotter pin 180 can be secured through an aperture of the alignment pegs 131 located on the underside of the assembled fixture assembly 100 to further retain the ring 130 onto the platform 122 of retaining base 120.

Figure 4:
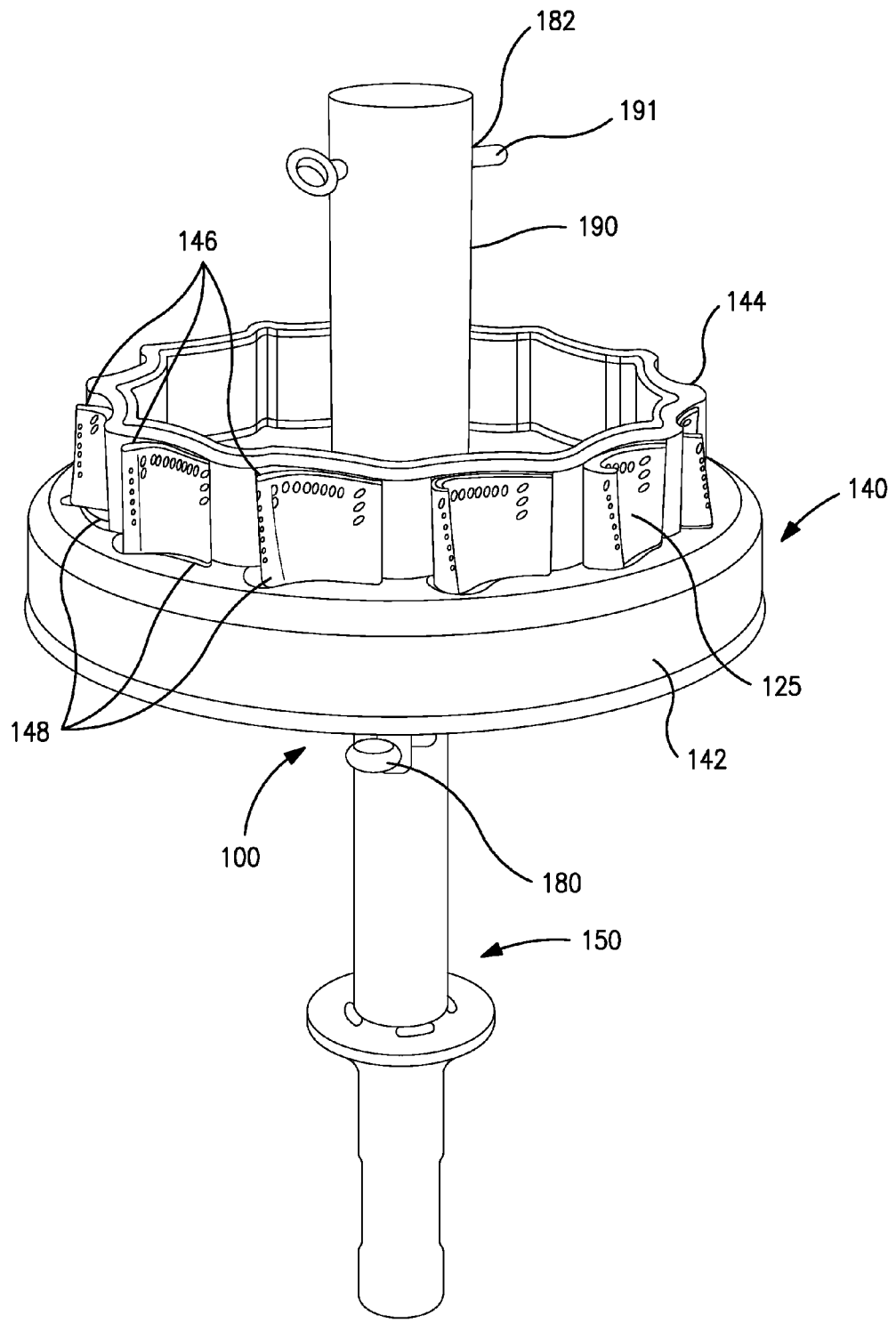
FIG. 4 is an assembled fixture assembly loaded with workpieces and configured for use in a masked coating operation in accordance with an embodiment of the present invention.
Figure 5:
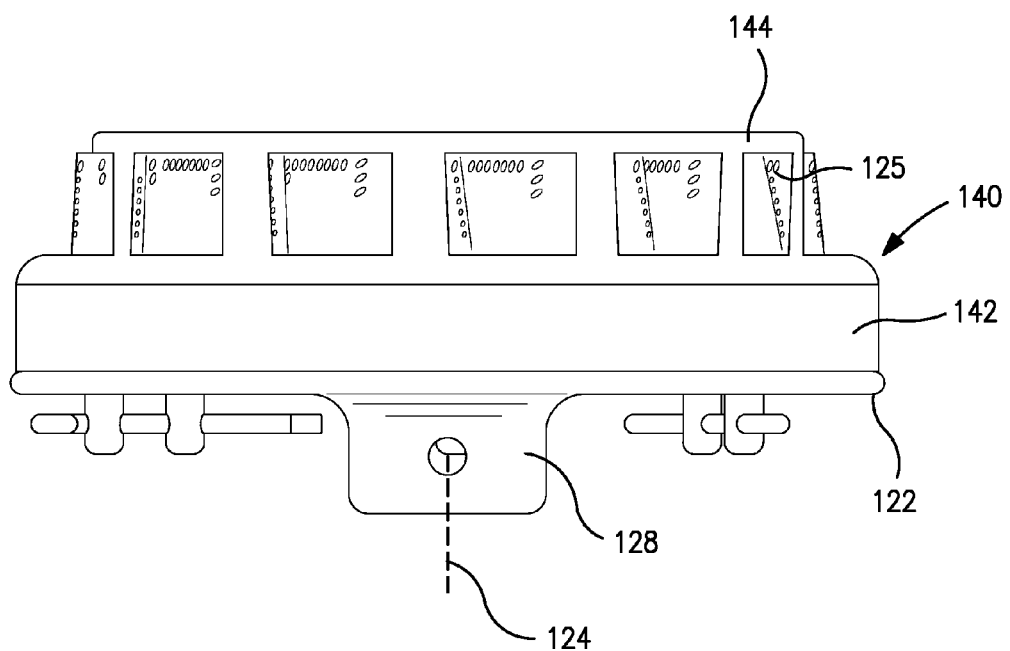
FIG. 5 is a side view of FIG. 4 without illustration of the arbor shaft.

FIG. 3 shows that engagement of the retaining base 120 and positioning ring 130 with cotter pins 180 secured along the backside of the retaining base 120. The workpieces 125 are shown fixated in an upright and fully exposed orientation. The tooling fixture assembly 100 as fully assembled in FIG. 3 can provide structural support or a seat for any other components that are superimposed thereon. For example, where the process operation is a coating process, as seen in FIGS. 4 through 6, a masking cap 140 is preferably placed over the combination of retaining base 120 and positioning ring 130. In another example, where the process operation is a grit blasting process, as shown in FIG. 7, the combination of retaining base 120 and positioning ring 130 are placed on the arbor 150 above a series of other structures specifically designed for the grit blast process, including a support base manifold 220. In addition, a grit blast cover 240 is preferably placed on the arbor over or on top of the combination of retaining base 120 and positioning ring 130. The modular fixture assembly 100 with workpieces 125 loaded therein allows the fixture assembly 100 to be transferred from the coating station to the grit blast station and vice versa without disassembling and re-assembling the plurality of workpieces 125 from the tooling fixture assembly 100.

Referring to FIGS. 2 and 3, the arbor of shaft 150 is a component that can be incorporated into the multifunctional fixture assembly 100 and is comprised of several sections including a distal section 152, a middle section 153, and a proximate or lower section 154. The distal end 155 of the arbor 150 has a hole 156 through which the cotter pin is inserted to lock together the various components of the tooling fixture assembly 100. The shaft diameter at or near the distal section 152 is selected to operatively engage the masking cap 140. The middle section 153 of the arbor 150 has a shaft diameter larger than the shaft diameter of the distal section 152 and is sized to operatively engage the retaining base 120 and secure it in the prescribed position along the arbor 150. The lower section 154 of the arbor 150 is sized to be mounted in and engage with, for example, the rotating drive of the coating device or a conduit 280 (FIG. 7) of a grit blast station as shown in FIG. 7.

The fixture assembly 100 of FIG. 3 can be incorporated into a coating operation. FIGS. 4-6 show an embodiment of the present invention in which a masking cap 140 includes a support housing 142 designed to slide over the plurality of workpieces 125 and the retaining base 120 and positioning ring 130. The support housing 142 includes a plurality of openings 148 that expose the portions of the workpieces 125 to be coated. Connected to the support housing 142 is a unitary mask structure 144 having a plurality of solid walls 146. The walls 146 extend away from the support housing 142 in a substantially vertical orientation to mask portions of the workpieces 125 that are not to be coated.

Where the workpieces 125 to be coated are turbine airfoils, the solid walls or surfaces 146 of the unitary mask structure 144 are configured to conform to the shape of and generally abut most of the surfaces of the airfoil blade 125 that are not to be coated including, for example, the trailing edge as well as portions of the platform and convex side of the airfoil blades 125 while exposing the portions or surfaces of the airfoil blades 125 to be coated.

Proximate the top of the unitary masking structure 144 of the masking cap 140 is a center alignment hole or aperture 143 (FIG. 6) through which the arbor 150 extends. As indicated above, the masking cap 140 slides over the plurality of loaded workpieces 125, the retaining base 120, and the positioning ring 130 using the arbor 150 as a guide for alignment of the pieces. A spacer 190 with retention means (e.g., cotter pin 191) shown in FIG. 4 secures the masking cap 140 to the fixture assembly 100. FIG. 4 also shows that the arbor 150 is locked at a location above the top of the unitary masking structure 144 by engaging with spacer 190 to lock the assembly in place and ensure the entire tooling fixture assembly 100 and any workpieces 125 therein rotate as a single unit or assembly as the arbor 150 is rotated during the coating process.

Referring to FIG. 2, in operation of the illustrated embodiment, twelve workpieces 125 or airfoils are loaded into the anchor members 132 of the positioning ring 130. FIG. 2 shows one of the workpieces 125 in isolation from the others for purposes of indicating that the workpieces 125 are slidably mounted or loaded into their respective anchor members 132. Having mounted each of the twelve workpieces 125 onto their receptive anchor members 132, the workpieces 125 the airfoils 125 attain a fixed orientation as the airfoils 125 are configured in an extended and upward orientation from the positioning ring 130. The retaining base 120 is then engaged with the positioning ring 130 such that the retaining member 126 engages the exposed surface in the root section of the airfoil. The retaining base 120 is then rotated slightly relative to the positioning ring 130 so as to lock the base 120 and ring 130 together and prevent movement of the plurality of workpieces 125 in any direction. The arbor 150 is then inserted through the collar 128 (FIG. 5) and central aperture 124 (FIG. 5) of the retaining base 120 and upward through the positioning ring 130 forming the tooling fixture assembly 100. FIG. 3 shows the resultant locked fixture assembly 100 loaded with workpieces 125 and operatively connected to the arbor 150.

For the fixture 100 of FIG. 3 to be used in an actual coating process, a masking cap 140 (FIG. 4) is aligned with the airfoils 125 and slid down the arbor 150 and over the upwardly extending airfoils 125 and the combination of the positioning ring 130 and retaining base 120. The masking cap 140 is supported by and seats on the retaining base 120 and/or positioning ring 130. In such position, the upper portion or unitary mask structure 144 of the masking cap 140 engages or covers portions of the airfoils or workpieces 125 to be masked and leaves exposed those surfaces of the workpieces 125 or airfoils to be coated. FIG. 4 shows that a cotter pin 191 is then inserted through a hole 182 in a spacer 190 disposed above the masking cap 140 to lock the tooling fixture assembly 100 and arbor 150 with the mask structure 140.

FIG. 5 shows that the illustrated retaining base 120 also includes a collar 128 extending from the platform 122 along the central axis 124 in the opposite direction from the retaining members 126, the collar 128 being adapted to receive the arbor 150. As illustrated in the drawings, the inner diameter of the collar 128 corresponds to the diameter on a portion of the arbor 150 so as to vertically align the arbor 150 within the tooling fixture assembly 100.

FIG. 6 shows a top view of the fixture assembly 100 having the masking cap 140. The workpieces 125 are shown loaded onto the positioning ring 130, which is locked onto the retaining base 120. The support housing 142 includes openings 148 that expose the portions of the workpieces 125 to be coated. The workpieces 125 extend upwards towards the upper or unitary mask structure 144. The upper portion or unitary mask structure 144 of the masking cap 140 covers portions of the airfoils or workpieces 125 to be masked. Center alignment hole or aperture 143 receives arbor 150.

FIG. 7 shows the tooling fixture assembly 100 to be used in grit blasting operations. The assembly process involves placing the fixture assembly 100 onto manifold components 250. A process shaft or arbor 150 extends through a central axis of the manifold. Next, the combination of the retaining base 120 and positioning ring 130 with the workpieces 125 and arbor 150 are operatively coupled with a grit blast cover 240 that is lowered on the arbor 150. A cotter pin 755 is then inserted through the hole 752 in the arbor 150 above the cover 240 to lock the grit blast tooling fixture assembly around the plurality of workpieces. During the grit blasting, pressurized air can enter upwards from conduit 280 into the manifold 250.

As described above, the presently illustrated tooling fixture assembly 100 uses the retaining base 120 and positioning ring 130 to load multiple parts or workpieces 125 in a simple and rapid fashion thereby significantly reducing the labor and labor costs associated with loading and securing the multiple workpieces within the tooling fixture assembly. Of particular advantage with the present tooling fixture assembly 100 is that there are little or no moving parts such as hinges, clasps, springs, etc. or assembly accessories such as wires that are commonly found in conventional tooling fixtures for rotor blades, stator vanes, airfoils etc. More importantly, the tooling fixture assembly 100 disclosed herein is modular and useful in multiple different functions without needing to assemble/disassemble the workpieces from the fixture at each process step. Such process steps may include cleaning, grit blasting, coating and other preparation or finishing processes.

When used in a coating operation, the illustrated embodiment includes a one-piece masking cap that allows simultaneous or concurrent masking of the multiple workpieces. In other words, use of the unitary masking cap, the masking of a plurality of workpieces is accomplished in a fraction of the time required with conventional tooling fixtures.

Similarly, when used in a grit blast operation the illustrated embodiment includes a use of various unitary structure elements designed for the grit blasting operation such as a unitary cover, one-piece gasket or seal, unitary support base, unitary manifold, etc. Using the unitary structures makes the overall grit blasting function, of similar preparation and finishing processes, simpler and more cost effective.

While the size of the process equipment often dictates the maximum size of the tooling fixtures, the illustrated embodiments provide the ability to process more workpieces using the described modular tooling fixture. This increased capacity is directly attributed to the design of the retaining base and positioning ring that elegantly secures the plurality of workpieces with optimized spacing between workpieces and without any hinged elements, wires, clasps, etc. Also, because of the simplicity and lack of moving parts, the individual components of the illustrated tooling fixture assembly are much easier to clean and maintain compared to the prior art tooling assemblies.

The presently disclosed embodiments of the tooling fixture assembly and components thereof are preferably formed from casting process. As cast-able components, there are no welds in the tooling fixture assembly. Eliminating the welds in the fabrication process reduces the number and magnitude of cracks and crevices in the tooling fixture assembly that can lead to failure and potentially trap contaminates.

The tooling fixture assembly described herein has particular utility in the coating of turbine engine airfoils and it reduces the cost associated with the overall coating process, including any preparation, coating, and finishing process steps as well as improving the workpiece quality and yield compared to prior art tooling fixture assemblies.

A further improvement of the new tooling fixture assembly is the reduction of the ratio of thermal mass of the fixture assembly relative to the thermal mass of the workpieces to be coated. The net result can be a shorter heat up time which can translate into increased productivity. Typically, the workpieces are pre-heated in vacuum before coating. The preheating occurs in a pre-heater, which uses radiant heating elements to heat the workpieces to be coated to a temperature of about 1900° F. to 2000° F. The time required to bring the workpieces to this elevated temperature is generally dependent upon the surface area of the fixture assembly 10, which is exposed to the heating elements of the pre-heater. Even more so, the required heating time can be significantly dependent upon the thermal mass of the workpieces. Consequently, conventional fixture-part assemblies require significant preheat time to attain the required elevated temperature. By way of illustration, conventional fixture-part assemblies can typically have a thermal mass ratio of fixture to workpiece of about 2.0. The present invention offers a unique design for an optimized fixture assembly that reduces the thermal mass ratio to a factor of 1.5 or lower, thereby accelerating the pre-heat time for the complete part—fixture assembly. This is a significant design and process improvement that results in productivity enhancements which can shorten the pre-heat time of the workpieces by approximately 10% to 15%.

From the foregoing, it should be appreciated that the present invention thus provides a tooling fixture assembly for use in multiple coating related operations. While the invention herein disclosed has been described by means of specific embodiments and processes associated therewith, numerous modifications and variations can be made thereto by those skilled in the art without departing from the scope of the invention as set forth in the claims or sacrificing all of its features and advantages.

The invention claimed is:

1. A modular, rotisserie type tooling fixture assembly for use in multiple different coating related operations, the tooling fixture assembly comprising:
    a positioning ring having a plurality of anchor members configured to receive a plurality of workpieces during the multiple different coating related operations, wherein said workpieces remain fixed relative to a plurality of retaining members, and said plurality of retaining members remain fixed relative to the positioning ring; and
    a retaining base defining a central aperture extending therethrough wherein the retaining base is configured to rotate to allow locking engagement of said plurality of retaining members with the anchor members of the positioning ring to retain the plurality of workpieces in a fixed manner relative to the anchor members, and the anchor members remain fixed relative to the positioning ring during the multiple different coating related operations, said retaining members disposed in a prescribed radial orientation from a central axis of said tooling fixture assembly, said central axis extending through said central aperture;
    wherein the retaining base further comprises a platform, where the plurality of retaining members rise from a surface of the platform; wherein the engagement of the positioning ring with the retaining base is configured to receive one or more components for the multiple different coating related operations without disassembling and re-assembling the plurality of workpieces from the tooling fixture assembly.

2. The fixture assembly of claim 1, wherein the positioning ring comprises a plurality of alignment pegs configured to extend through corresponding alignment holes of the retaining base.

3. The fixture assembly of claim 1, wherein the anchor members are configured to engage a root section of at least one of the plurality of workpieces.

4. The fixture assembly of claim 1, further comprising an arbor operatively coupled to the retaining base through the central aperture, wherein the arbor is selectively guided to align and engage with the one or more components.

5. The fixture assembly of claim 1, wherein the one or more components is a grit blast cover, the grit blast cover disposed over the positioning ring.

6. The fixture assembly of claim 1, wherein the one or more components is a unitary masking cap structure, the masking cap structure is disposed over and in engagement with the retaining base and positioning ring, the mask cap structure including a plurality of solid walls or surfaces adapted to cover portions of the plurality of workpieces in a masking relationship.

7. The fixture assembly of claim 6, wherein the cap structure has an opening through which an arbor extends.

8. The fixture assembly of claim 1 further comprising an auxiliary retention means for securing the retaining base to the positioning ring.

9. The fixture assembly of claim 1, wherein the plurality of workpieces is 12 and each anchor member is configure to receive one workpiece.

10. The tooling fixture assembly of claim 6, wherein a top portion of the cap structure is characterized by contoured surfaces conforming to the curvature of backsides of each of the workpieces.

11. The tooling fixture assembly of claim 6, wherein a bottom portion of the cap structure is a housing structure that contains corresponding openings that expose portions of the workpieces to be coated.

12. The tooling fixture assembly of claim 6, wherein a bottom portion of the cap structure is configured to mask a portion of the platform and root regions of a plurality of airfoil workpieces.

* * * * *